United States Patent
Li

(10) Patent No.: US 7,710,801 B2
(45) Date of Patent: May 4, 2010

(54) CIRCUITRY AND METHOD FOR AN AT-SPEED SCAN TEST

(75) Inventor: Zhensong Li, Singapore (SG)

(73) Assignee: Infineon Technologies AG, Neubiberg (DE)

(*) Notice: Subject to any disclaimer, the term of this patent is extended or adjusted under 35 U.S.C. 154(b) by 250 days.

(21) Appl. No.: 11/755,758

(22) Filed: May 31, 2007

(65) Prior Publication Data
US 2007/0245180 A1    Oct. 18, 2007

(30) Foreign Application Priority Data
Dec. 13, 2004    (WO) ................. PCT/IB2004/004089

(51) Int. Cl.
*G11C 29/32* (2006.01)
(52) U.S. Cl. ...................................... 365/201
(58) Field of Classification Search ................. 365/201
See application file for complete search history.

(56) References Cited

U.S. PATENT DOCUMENTS

| | | | |
|---|---|---|---|
| 5,349,587 A | 9/1994 | Nadeau-Dostie et al. | |
| 5,680,543 A | 10/1997 | Bhawmik | |
| 5,909,451 A | 6/1999 | Lach et al. | |
| 6,014,763 A * | 1/2000 | Dhong et al. | ............... 714/724 |
| 6,065,145 A | 5/2000 | Bencivenga | |
| 6,070,260 A | 5/2000 | Buch et al. | |
| 6,195,776 B1 | 2/2001 | Ruiz et al. | |
| 6,327,684 B1 | 12/2001 | Nadeau-Dostie et al. | |
| 6,966,021 B2 * | 11/2005 | Rajski et al. | ............... 714/726 |
| 7,134,061 B2 * | 11/2006 | Agashe et al. | ............... 714/726 |
| 2002/0120896 A1 | 8/2002 | Wang et al. | |
| 2003/0084390 A1 | 5/2003 | Tamarapalli et al. | |
| 2003/0101396 A1 | 5/2003 | Price | |
| 2003/0169070 A1 * | 9/2003 | West et al. | ..................... 326/38 |

FOREIGN PATENT DOCUMENTS

| | | |
|---|---|---|
| EP | 1293791 A2 | 3/2003 |
| JP | 08201481 A1 | 8/1996 |
| WO | 2004004089 A1 | 1/2004 |

* cited by examiner

*Primary Examiner*—Hoai V Ho
*Assistant Examiner*—Jay Radke

(57) ABSTRACT

An integrated circuit has a plurality of clock domains and a plurality of memory cells being configurable as operational memory cells or as scan test memory cells for testing the integrated circuit. A pulse generator of the integrated circuit generates pulses for triggering the memory cells when being configured as scan test memory cells, the pulse generator comprising a plurality of pulse outputs. The pulses are provided to the memory cells by multiplexer circuits selecting one of the pulses of the pulse generator and an operational clock.

13 Claims, 10 Drawing Sheets

$m \in [1,N]$ $a,b \in [1,N]$ $a,b \in [1,N]$

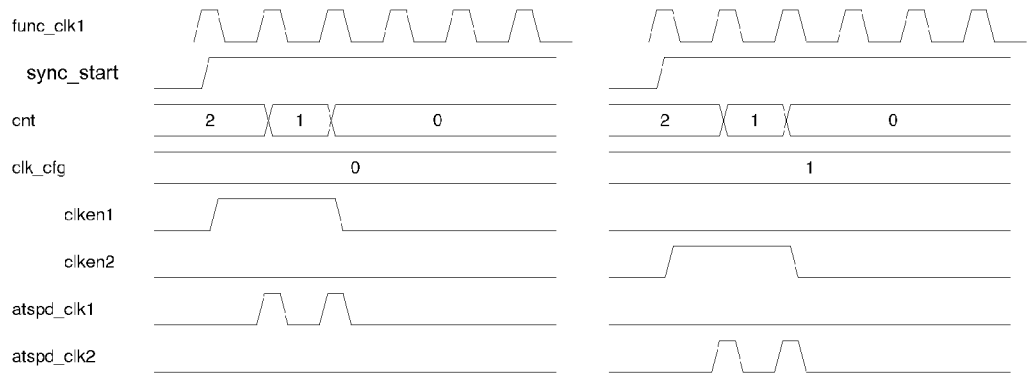
a)
b)
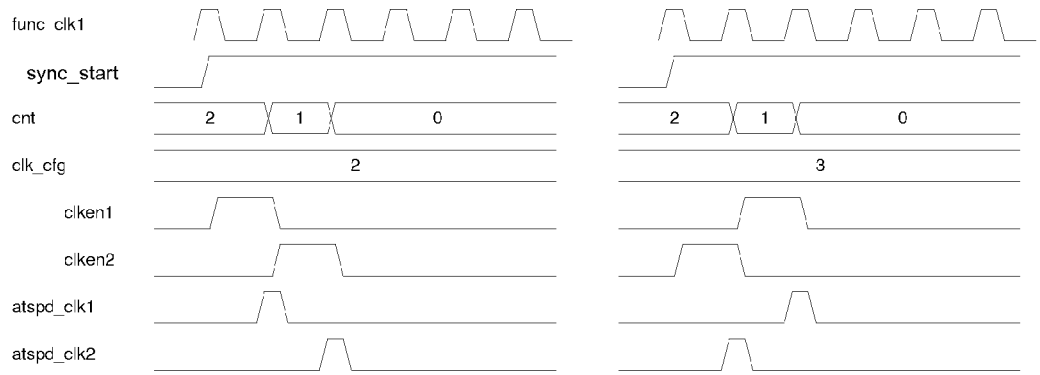
c)
d)
FIG 14

US 7,710,801 B2

CIRCUITRY AND METHOD FOR AN AT-SPEED SCAN TEST

RELATED APPLICATION

This application is a continuation-in-part of International Application PCT/IB2004/004089, with an international filing date of Dec. 13, 2004, which is hereby incorporated by reference in its entirety.

FIELD OF THE INVENTION

The invention relates to the application of a scan test within integrated circuits.

BACKGROUND

Integrated circuits with high densities need efficient testing with a high failure coverage and low test costs. Several techniques to add circuitry that support this testing are known as design for testability (DFT). Many of these DFT techniques are based on scan chain concepts. Scan chains contain memory cells that are connected as shift registers when a scan mode is applied. If no scan mode is applied, the memory cells are not connected as shift registers, but perform their application function in their operational mode. The shift registers form a chain from an input that is driven by a test controller to an output that may also be read by the test controller. The test controller may be implemented externally as part of an automated test equipment (ATE) or may be integrated in the circuit that is under test.

In a scan test, data is shifted from the input to the memory cells to put them into a state in which the integrated circuit has to be tested. A test stimulus is applied to let the chip perform a defined operation to verify the functionality of the integrated circuit. The result of this operation is stored as data in the memory scan cells. After this operation, this data is shifted to the output of the integrated circuit to compare it with expected values.

SUMMARY OF THE INVENTION

An integrated circuit configured to perform a scan test is provided. The integrated circuit comprises a plurality of memory cells being selectively configurable as operational memory cells or as scan test memory cells arranged in a plurality of clock domains. A pulse generator is adapted to generate pulses for triggering the memory cells when being configured as scan test memory cells, the pulse generator comprising a plurality of pulse outputs. The integrated circuit comprises further a plurality of multiplexer circuits each in communication with the memory cells of one clock domain and adapted to select one of the pulses of the pulse generator and an operational clock in order to provide pulses to the memory cells.

BRIEF DESCRIPTION OF THE FIGURES

FIG. 14 shows four timing diagrams a) to d) of the clock generation in the clock generation block of FIG. 13.

DETAILED DESCRIPTION

Figure 1:
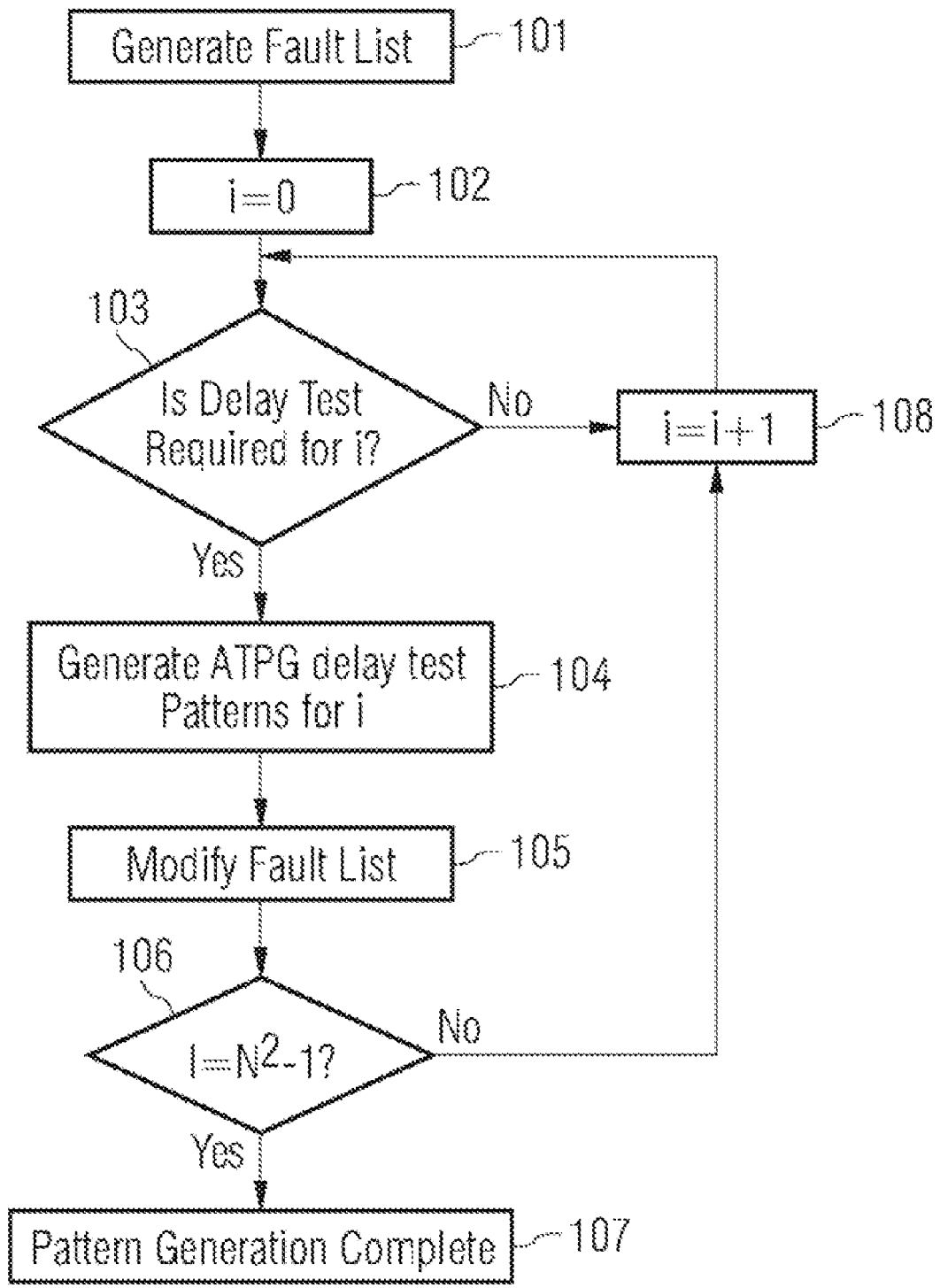
FIG. 1 is a flow chart of delay-fault testing of a system with N-clock domains in accordance with an embodiment of the present invention.

In the following a method for testing integrated circuits to detect delay faults is described. These delay faults may result from a signal path from a first block of an integrated circuit to a second block of an integrated circuit. If a signal from a memory cell in the first block takes too long to be captured by a memory cell of the second block, the signal causes a malfunction, in this case a delay fault. The first and the second blocks may be distinguished by the frequencies or the phases in which they are driven for application.

In a step a) the data is shifted into the scan memory cells at a reference frequency. Preferably, the scan memory cells were put into a scan test mode before step a).

A launch test clock pulse is applied to the first block at a launch test frequency in step b). The launch test clock pulse drives the memory cells of the first block and starts signals that are driven by this first block.

A capture test clock pulse is applied to the second block at a capture test frequency in a step c). The memory cells in the second block are activated by the capture test clock pulse. They store the signals that are driven to the inputs of the memory cells. The signals that were driven from the first block in step b) are now stored. If the propagation of the signal was too long, the storing takes place before the signal arrives. In this case a delay fault has occurred and is detected.

Data is now shifted from the scan memory cells to an output at the reference frequency in a step d). The output can be a pin of the integrated circuit that is read by an automatic test equipment.

In a last step e) the values at the outputs are compared with expected values. The values at the output are the data that was captured by the capture pulse in the second block of step c). Although the application speeds of the first and second blocks are different, the launch and the capture test frequencies are the same. The first edges of the launch test clock pulse and the capture test clock pulse are delayed with respect to each other by a period that is the reciprocal of the launch test frequency. The launch test frequency is specified according to the application speed requirement of a signal that runs through a signal path from the first block to the second block. This scheme eases the design of the circuitry because the launch and the capture test clock pulses can be derived from the same clock. The delay between the launch and the capture pulses is reciprocally proportional to the launch test frequency. Blocks running at different frequencies can easily be tested without the need of programming the phase differences between the launch and the capture cycles.

The advantage of the clock scheme is that the timing difference between launching and capturing clocks can be specified in accordance with the functional application speed and meanwhile both clocks can be pulsed at a common frequency which simplifies the design of the at-speed clock generation.

The launch test frequency is preferably the range of the reciprocal of the time that a signal needs to propagate from a latch in the first block to a latch in the second block without causing a delay fault.

If the launch capture frequency is 5 to 20% larger than the reciprocal of the time that a signal is allowed to propagate from a latch in the first block to a latch in the second block, the integrated circuit is tested with a margin to ensure that the integrated circuit still works under various conditions like over- or under voltage, temperature shifts and process variations.

If the reference frequency is slower than the launch and the capture frequency and is provided by an automatic test equipment (ATE), the path between the shift registers between memory cells is not time critical and eases the synthesis of the clock tree (CTS) This scheme also utilizes a low frequency ATE for at-speed testing which eliminates the dependency on high-end ATE's and hence reduces the overall test costs. However the reference frequency may be also equal to or in the same range as the test frequency.

If the application frequencies of clock a and of clock b are not multiples of each other, the method can easily be applied because the test frequencies just depend on the application speed requirements of signals between the first and the second block. It is not necessary to program and to control the phase differences between the launch and the capture pulses because the phase differences of the pulses result from the launch and capture test frequency.

In another embodiment of the invention, a method is provided for generating test patterns to test integrated circuits that have N blocks being distinguished by theNdifferent frequencies. N is an integer larger than 1. The method starts with a step a) in generating an empty fault list that consists of N times N elements. In a next step a counting variable i is set to 0. It is checked in a next step c) if a delay test is required for the element i. Element i corresponds to a launch cycle in block j and a capture cycle in block k. j is calculated by dividing i by N and rounding the result of this division down to the next integer. k is calculated by subtracting j times N from i. If a delay test is required the method continues with step e), else with step g).

In step e) a test pattern is generated for a launch test pulse for block j and a capture test pulse for block k. The testing pattern is preferably a list of commands that an automated test equipment runs to test an integrated circuit.

The test pattern is generated by an automated test pattern generator (ATPG), a computer program that helps to generate the list of commands.

The test pattern that was generated in step e) is stored in the fault list as the elements i. In a next step g), it is checked if i is equal to $N^2-1$. If this is the case, the method continues with step i), else the test is finished.

In step i), the variable i is incremented by 1 and the method continues with step c).

This method provides a structural testing of all possible signal paths between the clock domains, thereby generating test patterns only for those clock domains in which delay faults can occur. The test pattern that was generated in step e) is preferably a test pattern that carries out a method for testing integrated circuits to detect delay faults according to the first embodiment of the invention.

The decision of step c), if a delay test is required for the blocks j and k, is based on the use of the design information. During the design of the integrated circuit the information, if there is a signal path between block k and block j, is available. If there is a signal path, a delay test is required. The frequencies that are used for the launch test pulse and the capture test pulse are also determined by use of the design information. The length of the signal paths and the timing conditions are specified during the design of the integrated circuit. This information can be used to specify the frequency of the launch test pulse without the need of running a characterization test to define the frequencies and the delay.

FIG. 1 is a flow chart of the delay-fault testing of a system with N-clock domains in accordance with an embodiment of the present invention. An integrated circuit consists of N blocks, each running at a different clock. The clocks differ in frequencies or phases. Different frequencies may or may not be multiples of each other. For an integrated circuit with N-clock domains, faults can be classified into $N^2$ groups according to the possible number of combinations of launch and capture clocks, which may or may not need to be asserted at-speed. For example, a delay test is not needed for faults located between clock domains which are asynchronous to each other. There are overall $N^2$ clock configurations based on the number of different fault groups.

To generate a complete set of test patterns a fault list is initialized in a first step 101, the fault list consisting of $N^2$ elements. The elements contain either a test pattern or the 30 information that no test pattern is needed. After the initialization, all elements have a value that indicates that no test pattern is needed.

The elements of this fault list differ in the blocks to which the launch and capture clocks are applied. For example, the first element contains a test pattern for the first block driven by a launch and the second block driven by a capture clock. The second element carries the test pattern for a first block being tested with the launch and the second block being tested with the capture clock.

A counting variable i is initialized and set to zero in a step 102.

A decision 103 is made if a delay test is required for the element with the actual number i. The number of the clock domain for the launch cycle is calculated by dividing i by N and rounding the result of this operation down to the next integer. The clock domain number for the capture cycle is calculated by subtracting the number of a launch domain times seven from i. If, for example, the counting variable i is 0 and the number of domains N is 7, the launch and the clock domains are 0. If, in a modification, i is 10, the number of the launch domain is 1 and the number of the capture domain is 3.

If no delay test is required, the method continues with the increment step 108 in which i is incremented by one. After the increment step 108, the process continues with the decision 103. If a delay test is required, the ATPG delay test pattern is generated for the launch and capture domains that were calculated during the decision step 103. Then, the modification 105 of the fault list is done by writing the delay test pattern in the fault list as the element i.

In the following step 106, it is checked, whether i equals $N^2-1$. In this case the pattern generation is complete. Else, the process continues with the increment step 108.

According to the invention, an integrated circuit is also provided that comprises a plurality of clock domains, whereby the number of domains is N and each clock domain runs at a different application speed. Each clock domain contains memory cells. The integrated circuit also comprises at least one PLL that is on-chip and a plurality of application clock drivers. The application clock drivers may be PLL's, clock dividers, delay circuits or buffers.

An at-speed-clock generator has one clock input that is connected to one on-chip PLL. Control inputs and N outputs are also applied to the at-speed clock generator. The at-speed clock generator either keeps all outputs stable or drives clock pulses at two of the N outputs. The phase and the frequency of the two pulses is the same as the phase and the frequency of the clock input of the at-speed clock generator. Driving the at-speed clocks of the PLL makes it possible to run the launch and capture frequencies that exceed the limits of automated test equipment.

The integrated circuit comprises at least one scan path through the clock domains. Memory cells of the clock domains are used as the shift registers of the scan path.

In the integrated circuit, there is a plurality of N clock multiplexers, each of these clock multiplexers drives one clock domain. It selects either an output of the at-speed clock generator, an application clock or a shift clock. Each of the N outputs of the at-speed clock generator is connected to a different clock multiplexer and each of the N-application clocks is connected to a different clock multiplexer.

Figure 2:
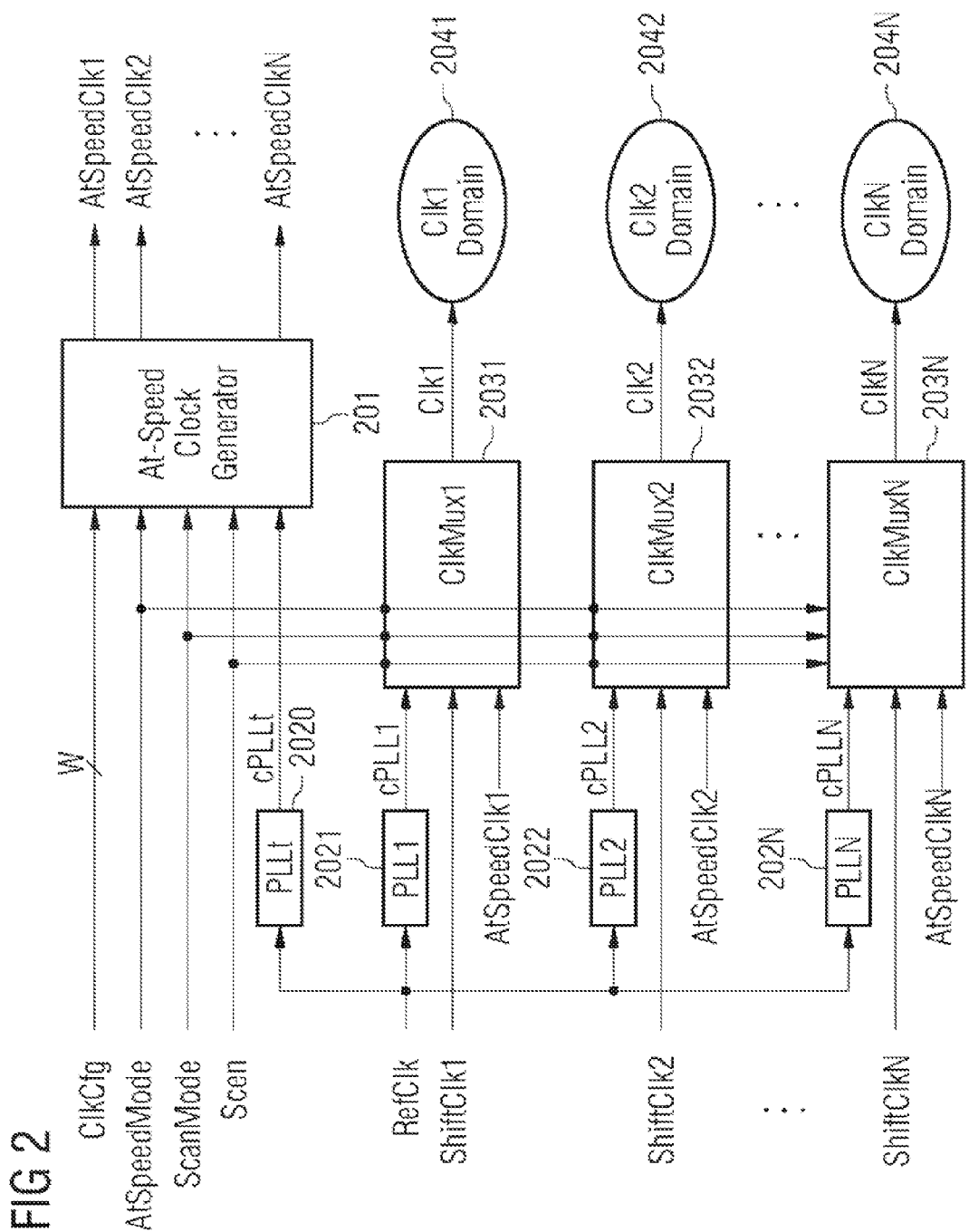
FIG. 2 shows a schematic block diagram of a circuit that generates and selects clocks for delay-fault testing in accordance with an embodiment of the present invention.

FIG. 2 shows a schematic block diagram of a circuit that generates and selects clocks for delay-fault testing in accordance with one embodiment of the present invention. The block diagram shows an AtSpeed Clock Generator 201, the PLL's 2020 to 202 N, the clock multiplexers 2031 to 203 N and the clock domains 2041 to 204 N. The described blocks are driven by the reference clock RefClk, the shift clocks ShiftClk 1 to ShiftClkN and the at-speed clock AtSpeedClk 1 to AtSpeedClkN. The reference clock RefClk is input to the PLL's 2020 to 202 N to generate the PLL clocks cPLLt to cPLLN. The At-Speed Clock Generator 201 generates the clock AtSpeedClk 1 to AtSpeedClkN from the PLL clock cPLLt depending on its control inputs ClkCfg, AtSpeed-Mode, ScanMode and Seen. The control input ClkCfg is a bus with a bus width W. W is equal to rounding up to the next integer of $2 \log_2 (N)$. If, for example, N is 7, the bus width W of ClkCfg is 6.

Each of the clock multiplexers 2031 to 203N selects one of three clocks to run one of the clock domains 2041 to 204N. A clock multiplexer with the number i receives the clocks cPLLi, ShiftClki, AtSpeedClki as inputs and outputs the clock Clki to its appropriate clock domain 204*i*. Which clock is selected depends on the control signals AtSpeedMode, ScanMode and Scen.

During application, the clock that is generated by one of the PLL's 2020 to 202N runs the clock domains 2041 to 204N at application speed.

To shift the data into the scan chain, low frequency clocks ShiftClk1 to ShiftClkN run the clock domains 2041 to 204N at relatively low speed that is within the range of the ATE.

For the application of the launch and capture phases, two of the clock domains 2041 to 204N are driven by fast clocks At-SpeedClk1 to AtSpeedClkN at a speed that is close to the application speed. Domains, others than the launch and the capture domains, are not driven by clock during the launch and capture phase.

Figure 3:
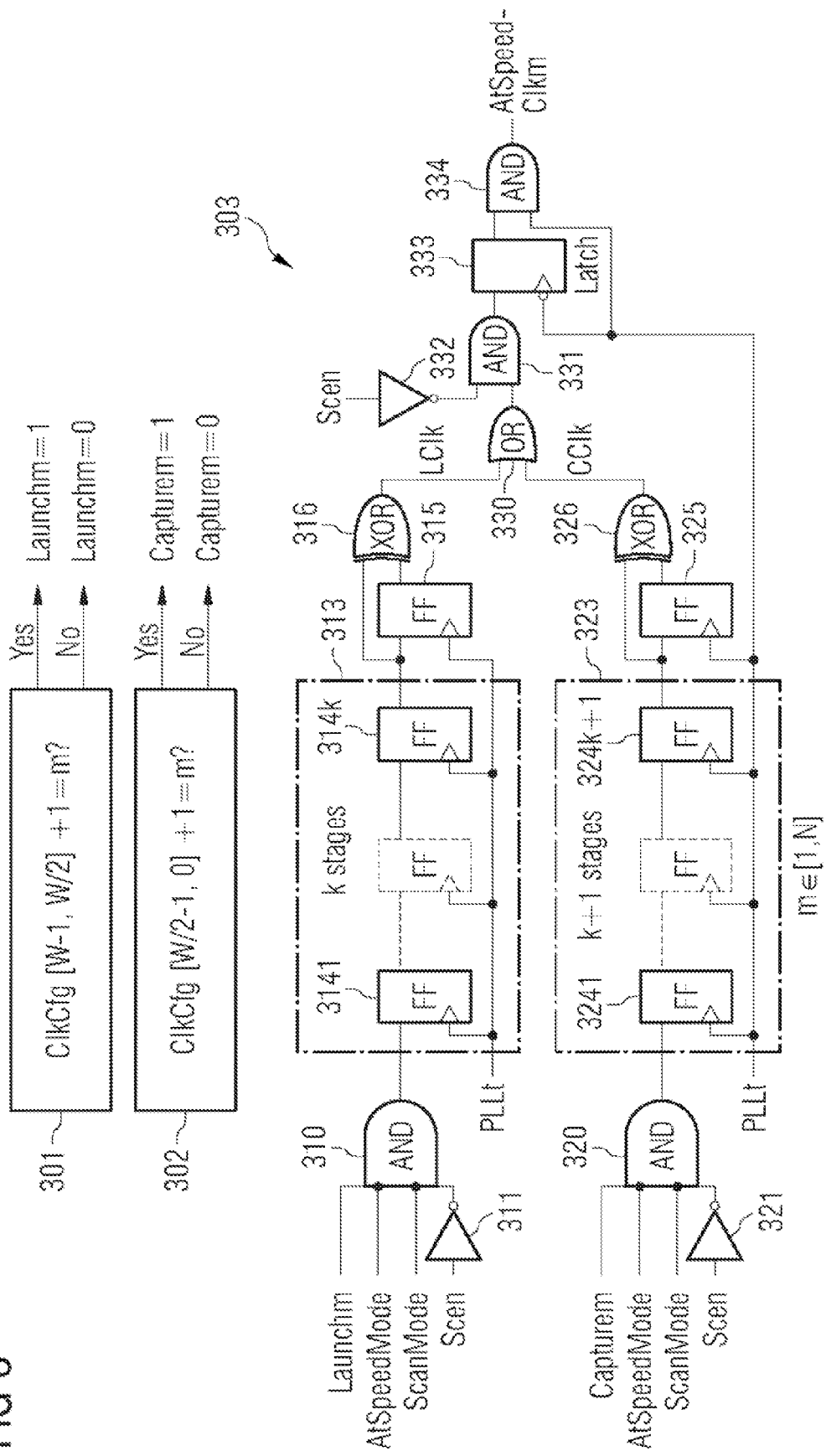
FIG. 3 shows details of a clock generation block of FIG. 2.

FIG. 3 shows details of the At-Speed Clock Generator 201 of FIG. 2. A At-Speed Clock Generator 201 has N instances of blocks that consist of a pair of ClkCfg decoders 301 and 302 and a pulse generators 303. m is the number of the instance in FIG. 3 and is a number between one and N.

The first ClkCfg decoder 301 detects if the upper half of the bus ClkCfg has a value that is equal to the number m minus one. If that is the case, the signal Launchm is set to 1, else it is set to 0. The second ClkCfg decoder 302 sets the signal Capturem to 1, if the lower half of ClkCfg bus is equal to the number of the instance m minus one, else the signal Capturem stays at 0. One and only one instance of the N instances within the At-Speed Clock Generator 301 has its signal Capturem at 1. It may be the same or different instances, for which the Launchm and the Capturem are one. The upper half of the bus ClkCfg ranges from the elements number W−1 to element number W/2 and the lower half of ClkCfg ranges between the elements W/2−1 to 0.

In an example of the design with two clock domains, N=2, ClkCfg=0 is associated with the fault launch and captured by Clk1; ClkCfg=1 is associated with the fault Clk1 and captured by Clk2; ClkCfg=2 is associated with the faults launch by Clk 2 and captured by Clk 1; ClkCfg=3 is associated with the faults launched and captured by the Clk 2.

The At-Speed Clock Generator is designed in a manner such that there is one and only one clock signal that is pulsed once in a launch cycle, with other clocks inactive; the same phenomena also applies to the capture cycle.

The pulse generator 303 generates a pulse at the output signal AtSpeedClkm dependent on its inputs Scen, Launchm, Capturem, AtSpeedMode, ScanMode and PLLt. The pulse generator 303 consists of four AND gates 310, 320, 331 and 334, three inverters 311, 321 and 332, two flip-flop rows 313 and 323, three single flip-flops 315, 325 and 333, two XOR gates 316 and 326 and an OR gate 330.

The first three inputs of the AND gate 310 are connected to the signals Laumchm, AtSpeedMode and ScanMode. The fourth input of the AND gate 310 is connected to Scen through the inverter 311. The output of the AND gate 310 is coupled to the first flip-flop of the flip-flop row 313. The flip-flop row 313 consists of k stages of flip-flops. The clock inputs of all k flip-flops are connected to the clock PLLt. The flip-flops 3141 to 304*k* are connected in a row such that the data output of a flip-flop l is connected to the data input of the next flip-flop l+1. The input of the first flip-flop 3141 is connected to the output the AND gate 310, the output of the last flip-flop 314*k* is connected to the data of the flip-flop 315 and to the first input of the XOR gate 316. The clock input of the flip-flop 315 is connected to the clock PLLt, its output is connected to the second input of the XOR gate 316. The output of the XOR gate 316 is coupled to the node LClk.

The first three inputs of the AND gate 320 are connected to the signals Capturem, AtSpeedMode and ScanMode. The fourth input of the AND gate 320 is connected with a signal Scen thru the inverter 321. The output of the AND gate 320 is connected to the data input of the first flip-flop 3241 of the flip-flop row 323. The flip-flop row consists of k+1 flip-flops 3241 to 324*k*+1. The clock inputs of these flip-flops 3241 to 324*k*+1 are connected to the clock PLLt, its outputs are connected to the data input of the appropriate next flip-flop. The output of the last flip-flop 324*k*+1 is connected to the data input of the flip-flop 325 and the first input of the XOR gate 326. The clock input of the flip-flop 325 is connected to the clock PLLt and its output is connected to the second input of the XOR 326. The output of the XOR gate 326 is connected to the node CClk.

The input of the OR gate 330 is connected to the signals LClk and CClk, its output is connected to the first input of the AND gate 331. A second input of the AND gate 331 is connected to the output of the inverter 332. The input of the inverter 332 is connected to the signal Scen. The output of the AND gate 331 is connected to the data input of the data latch 333. The inverting clock input of latch 333 is connected to the clock signal PLLt, its output being connected to the first input of the AND gate 334. The second input of the AND gate 334 is connected to the clock signal PLLt. The output of the AND gate 334 is coupled to the output signal AtSpeedClkm.

If the ScanMode is off, the signal Scen is low and all of the four inputs of the AND gate 310 can become high, if the signal Launchm is applied high. This is done to apply a capture pulse cycle by the instance with the number m. In this case, the output of the AND gate 310 becomes high, resulting in a clock pulse at the node LClk after k and a half cycles. Similarly, a clock pulse is generated at the node CClk if the ScanMode is off and the instances signal Capturem switches to high. A pulse at the node LClk or CClk is output at the node AtSpeedClkm synchronised with the clock PLLt.

Figure 4:
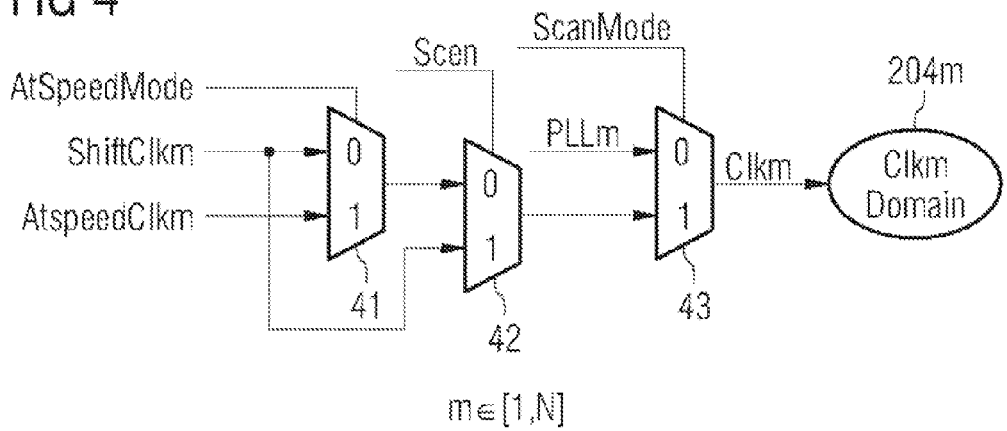
FIG. 4 shows a clock selection scheme associated with the circuit of FIG. 2.

FIG. 4 shows details of one of the clock multiplexers 2031 to 203N running one of the clock domains 241 to 204N shown in FIG. 2. A clock multiplexer consists of a first multiplexer 41, a second multiplexer 42 and a third multiplexer 43 running a clock domain 204m. The first and second data inputs of the multiplexer 41 are coupled to the nodes ShiftClkm and AtSpeedClkm, respectively. The control input of the multiplexer 41 is connected to the node AtSpeedMode. The first input of the multiplexer 42 is connected to the output of the first multiplexer 41, its second data input is connected to the node ShiftClkm and its control input is connected to the node Scen. The first input of the third multiplexer 43 is connected to the node PLLm, the second input is coupled with the output of the second multiplexer 42 and its control input is connected to the node ScanMode. The output of the third multiplexer 43 is connected to the node Clkm that runs the clock domain 204m. Table 1 is an overview of the above described functions of the clock multiplexer.

TABLE 1

| ScanMode | Scen | AtSpeedMode | Clkm |
|---|---|---|---|
| 0 | x | X | PLLm |
| 1 | 1 | X | ShiftClkm |
| 1 | 0 | 0 | ShiftClkm |
| 1 | 0 | 1 | AtSpeedClkm |

Figure 5:
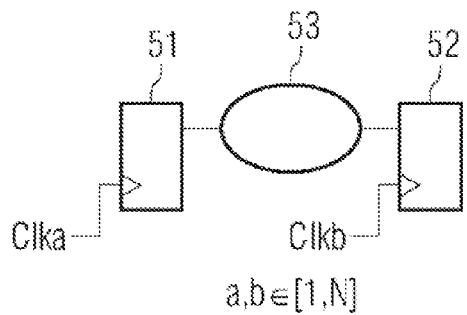
FIG. 5 shows two latches at which a delay-fault testing is applied.

FIG. 5 shows an example how two clocks Clka and Clkb are applied to two clock domains. a and b are elements of the natural numbers between 1 and N and may have different values for this example. The flip-flop 51 belongs to the clock domain a and the flip-flop 52 belongs to the clock domain b. The clock input of the flip-flop 51 is driven by the clock signal Clka while the clock input of the flip-flop 52 is driven by the clock Clkb. There are logic blocks 53 between the first flip-flop 51 and the second flip-flop 52.

In a delay-fault test, it has to be verified if the delay between the output of the first flip-flop 51 and the input of the second flip-flop 52 is not too large. Otherwise, this would result in a delay-fault. The test is performed by first shifting data into the flip-flops of the chip, then applying a launch pulse at the clock Clka and after a certain delay a capture pulse Clkb. The output of the second flip-flop 52 is shifted to the output of the integrated circuit and than compared to an expected value.

Figure 6:
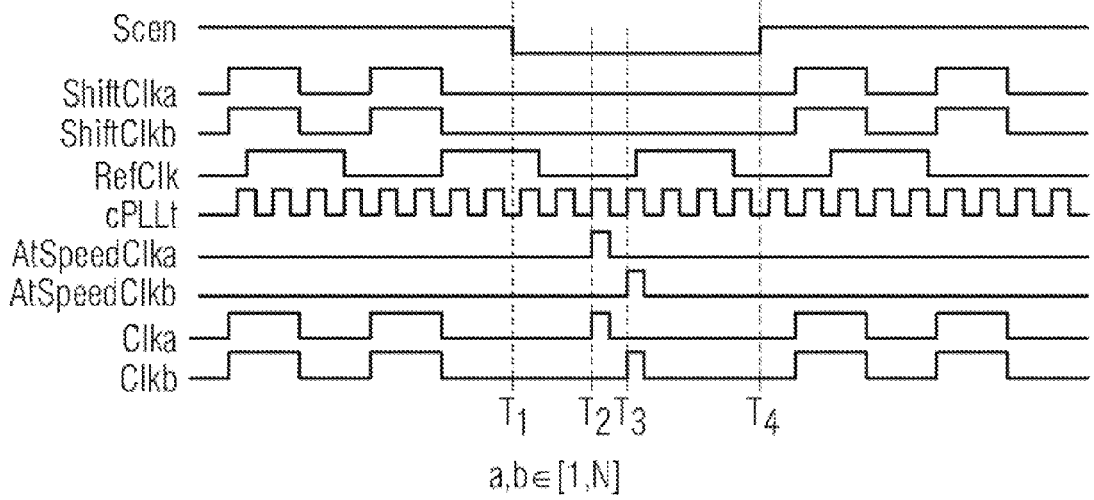
FIG. 6 is a timing diagram of a delay-fault test.

FIG. 6 is a timing diagram showing shift cycles, launch and capture cycles from the Clka domain to the Clkb domain in a system with N clock domains in accordance with one embodiment of the present invention. The timing of FIG. 6 is divided in a first shift phase until $T_1$, a launch-capture phase until $T_4$ and a second shift phase. During all the phases the signals AtSpeedMode and ScanMode are high to enable the delay-fault testing. The reference clock RefClk is driven by the external ATE. From this reference clock RefClk a PLL clock cPLLt is derived with a higher frequency. During the first shift phase the signal Scen is high, enabling the clocks Clka and Clkb to run at the frequency of the shift clocks ShiftClka and ShiftClkb. The shift clocks ShiftClka and ShiftClkb may also be derived from the ATE.

At $T_1$ the launch-capture cycle begins with Scen going low. After Scen went low, Clka is pulsed once with the same frequency of the PLLt after (k+1) cycles. k is an integer that depends on the number of synchronization stages that are required for the stabilization of Scen which is a high fan-out signal and which needs possibly a longer delay than a the PLL to stabilize. Clkb is pulsed in a similar manner after (k+2) PLLt cycles, which is always one PLLt clock later than the pulse of Clka.

When Scen goes low, the subsequent pulses are generated at the clocks AtSpeedClka and AtSpeedClkb beginning at $T_2$ and $T_3$, respectively. These two pulses drive the launch pulse at the node Clka and the capture pulse at the node Clkb. At $T_4$ the signal Scen goes high again to start the second shift phase to shift the data that was received at a flip-flop in the Clkb domain to the output. At the output the data that was received at the capture cycle is compared to expected values.

Figure 7:
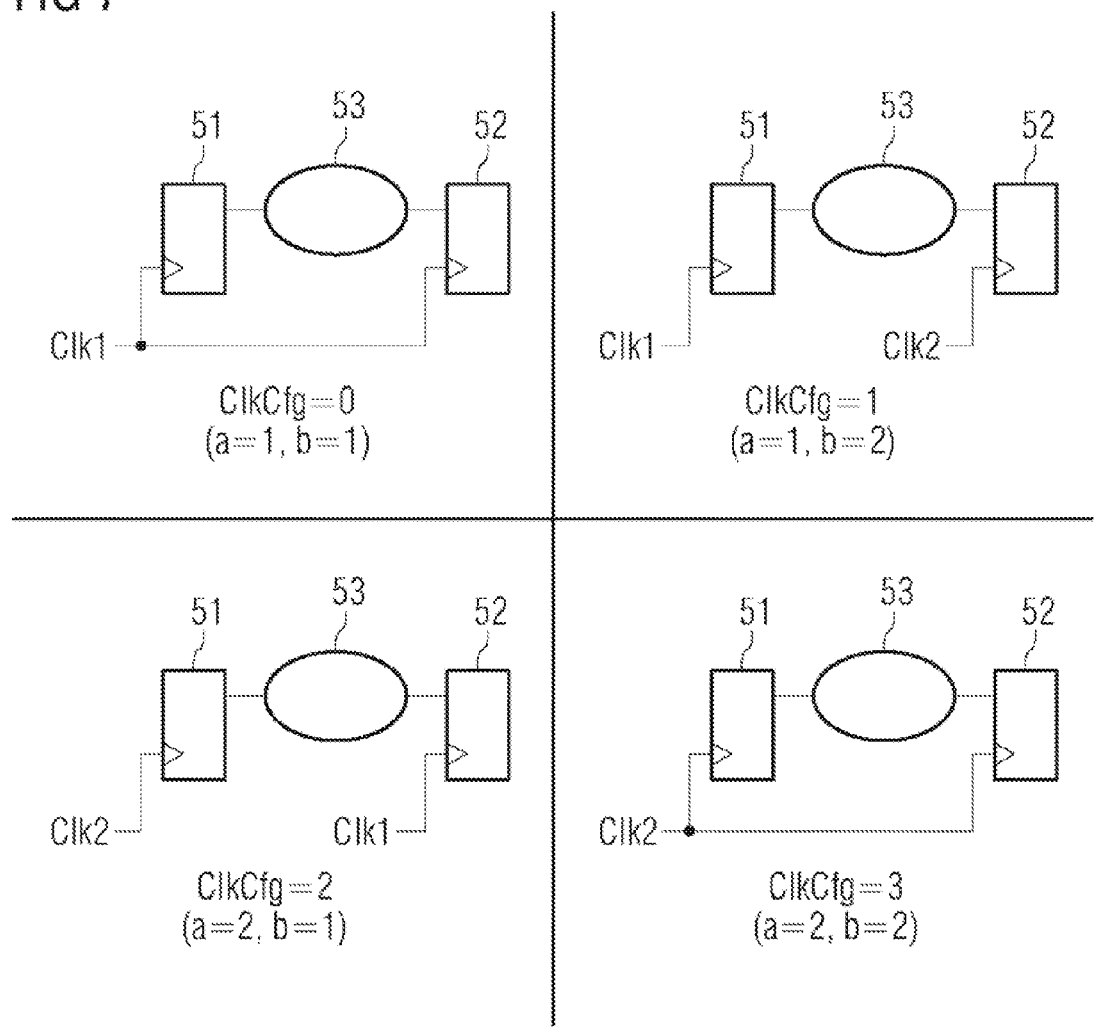
FIG. 7 shows four options for how two clocks can be applied to two latches for delay-fault tests.

FIG. 7 shows the four options of how two clocks can be applied to two flip-flops in different clock domains to test delay-faults. For every option, there is a first flip-flop 51, a second flip-flop 52 and a logic block 53 between the output of the first flip-flop 51 and the input of the second flip-flop 52. If the number of clock domains N is equal 0, the bus ClkCfg can have one of the values 0, 1, 2 or 3. In the upper left, ClkCfg is 0, a and b are both 1 and the launch and the capture pulses are both driven by the same clock Clk1 that is connected to the clock inputs of the first flip-flop 51 and the second flip-flop 52. In the upper right of FIG. 7, the launch clock is applied to the clock Clk1 at the clock input of the first flip-flop 51, whereas the capture pulse is driven by the clock Clk2 to the second flip-flop 52. In the lower half, the launch pulse at the first flip-flop 51 is driven by Clk2 and the capture clock at the second input 52 is driven by the clock Clk1. In a fourth option both, the launch and the capture clocks are both driven by Clk2.

Figure 8:
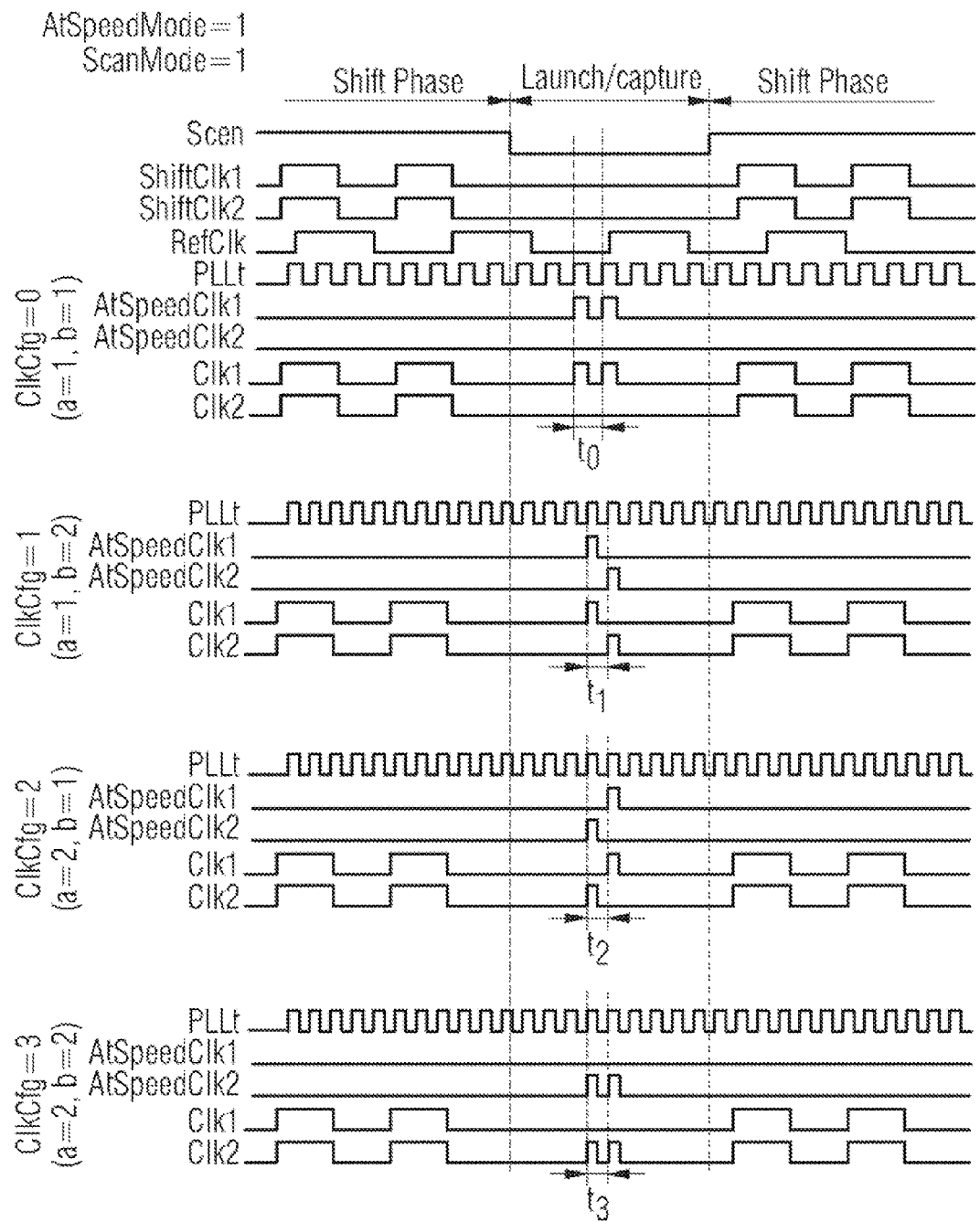
FIG. 8 is a timing diagram of delay-fault tests for the four options shown in FIG. 7.

FIG. 8 is a timing diagram of delay-fault tests for the four options shown in FIG. 7.

The timing diagram of FIG. 8 consists of three phases, a first shift phase, a launch-capture phase and a second shift phase. The first and the second shift phases are the same as a shift phases in FIG. 6 and will not be explained here in detail again.

For the first option, the bus ClkCfg is zero, thus, the launch and the capture clocks are driven by the same clock Clk1. In this case, the clock and the launch pulses are driven to flip-flops both being in the same clock domain Clk1. The time period between the launch and the capture pulses is $t_0$, the clock period of the PLL, which runs in range of the application frequency of the clock domain 1.

For ClkCfg=1, the launch pulse is driven in the first clock domain with a clock Clk1 and the capture pulse is driven in the second clock domain with Clk2. The delay between the launch and the capture pulses is $t_1$ which corresponds to the frequency of the PLL.

The frequency of the PLL is higher than the frequency in the case of ClkCfg=0. In the first case of ClkCfg=0, the delay between a capture and the launch event naturally equals to the period of the PLL clock that is in the range of the application frequency. At ClkCfg=1, the frequency of the PLLt is specified according to the functional speed requirement from Clk2 to Clk1, this frequency can differ from both application frequencies of Clk2 and Clk1.

In the second case with ClkCfg=1, the frequency of the PLL has to correspond to the delay to be tested between the launch and the capture flip-flops. Therefore, the PLL may run at a completely different frequency than the application frequencies of the clock domain 1 and the clock domain 2.

For ClkCfg=2, the launch clock is driven by Clk2 and the capture clock is driven by Clk1. In the fourth case with ClkCfg=3, both the launch and the capture pulses are driven by the clock Clk2 with a frequency that is in the range of the application frequency of the clock domain 2.

Figure 9:
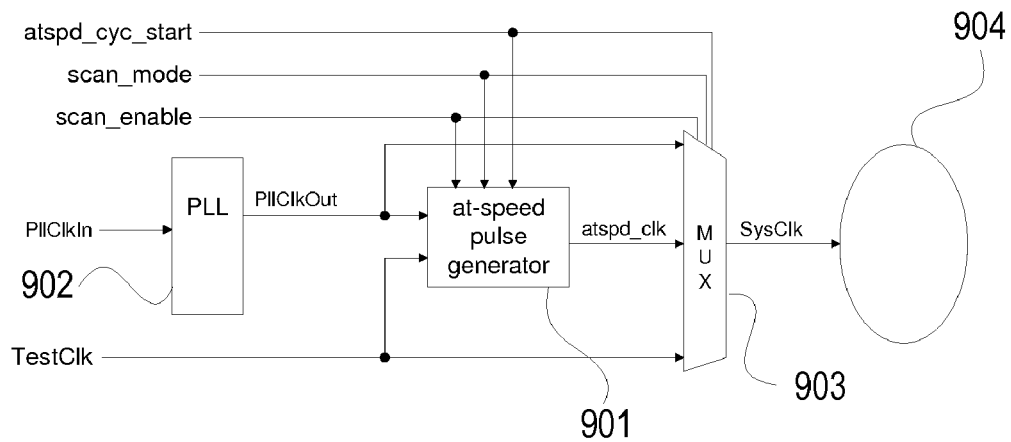
FIG. 9 shows a schematic block diagram of a circuit that generates and selects clocks for a scan test for a single clock domain.

FIG. 9 shows a schematic block diagram of a circuit that generates and selects clocks or pulses for the operation and the scan test of a system in a clock domain 904 according to one embodiment of the invention. The system 904 comprises memory cells that can be operated as normal operational memory cells for running the system in the normal operational mode and can be operated as scan test memory cells for a scan test of the system 904.

The circuit comprises an at-speed pulse generator 901, a PLL 902 and a multiplexer 903. The PLL 902 receives as input a clock PllClkIn and generates an operational clock PllClkOut with a frequency suitable for running the system in the clock domain 904. Running the system with the usual operational speed is also called at-speed operation. The output clock PllClkOut is provided to the at-speed pulse generator 901 and to an input of the multiplexer 903. The multiplexer 903 comprises further an input receiving a test clock TestClk, an input receiving pulses atspd_clk generated by the at_speed pulse generator 901 and an output communicating with the system in the clock domain 904. The TestClk may have a lower frequency and may be provided by an external test equipment. The TestClk is used for shifting test data into and reading data from the scan chains.

For clocking the system 904 with a system clock SysClk the multiplexer 903 can select the operational clock PllClkOut generated by the PLL 902, the pulses generated by the at-speed pulse generator 901 or the TestClk according to the status of control signals atspd_cyc_start, scan_mode and scan_enable which are also provided to the at-speed pulse generator 901. SysClk receives clock pulses from PllClkOut during normal operational mode when scan_mode=0. SysClk receives clock pulses from TestClk during stuck-at scan test at low speed and the shifting phase of at-speed scan test when scan_mode=1 and atspd_cyc_start=0 or scan_enable=1. SysCik receives clock pulses from atspd_clk during launch/capture phase of at-speed scan test when scan_mode=1, sca_enable=0 and atspd_cyc_start=1.

Figure 10:
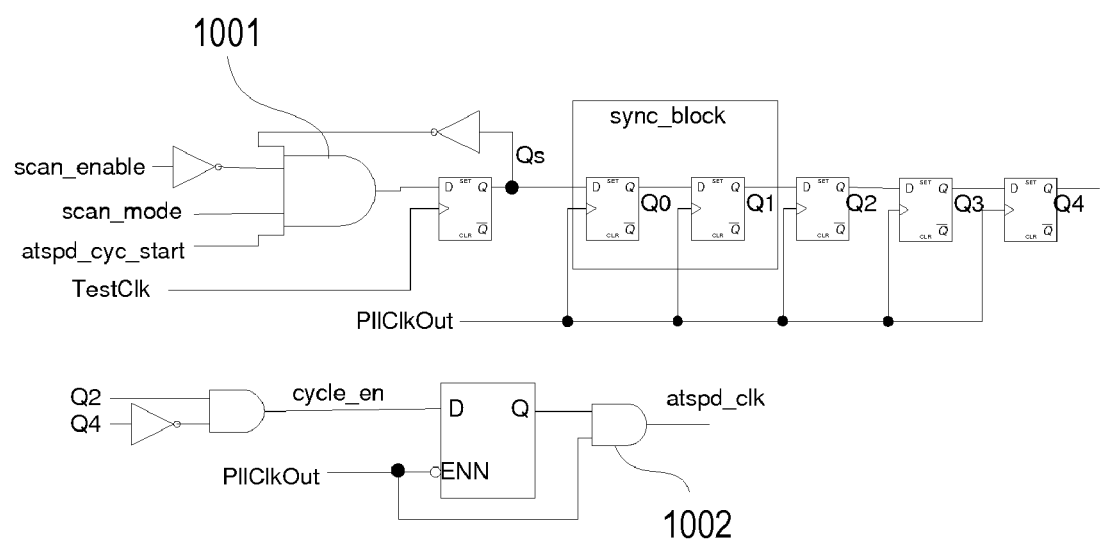
FIG. 10 shows details of a clock generation block of FIG. 9.
Figure 11:
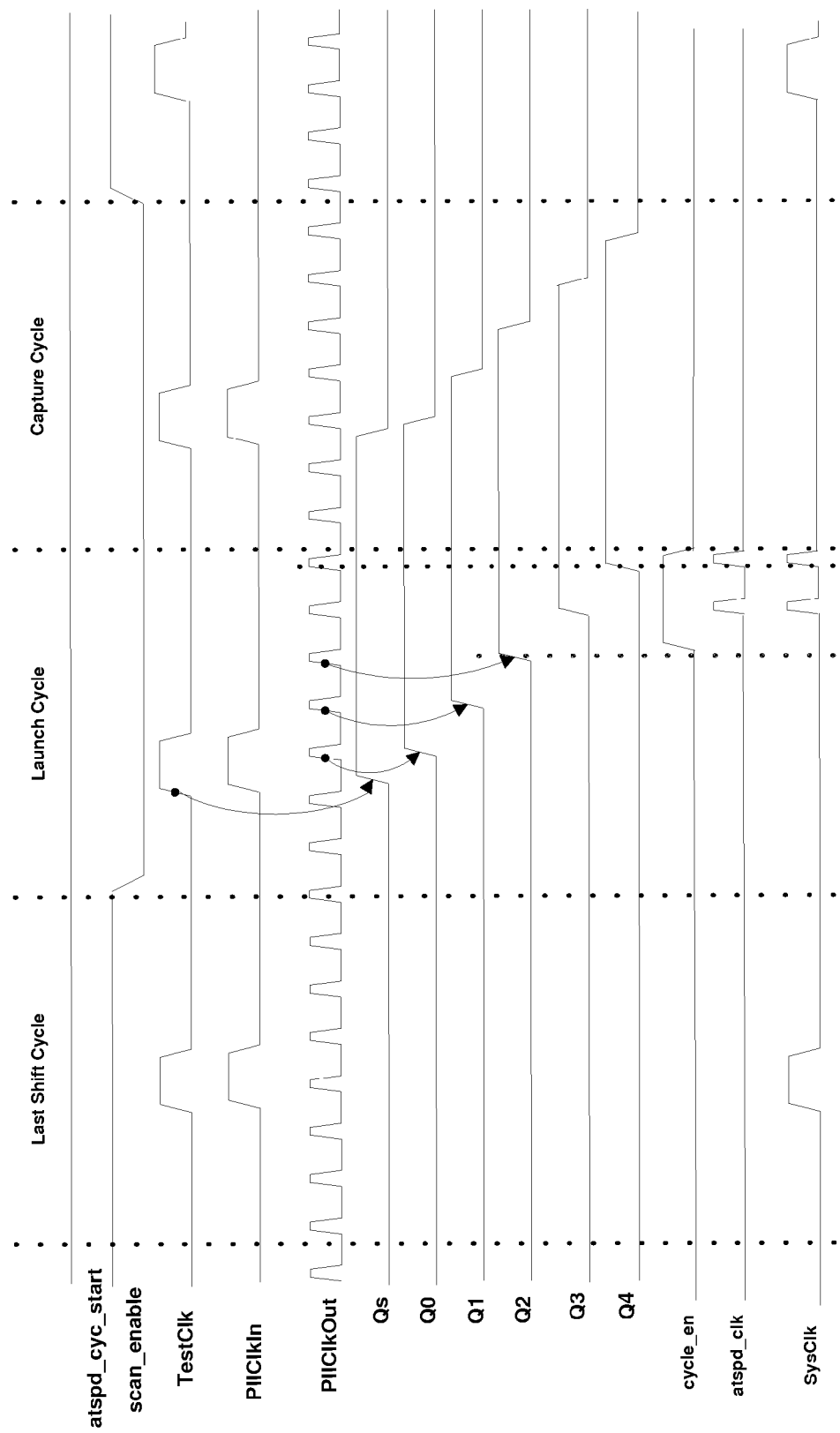
FIG. 11 is a timing diagram of the clock generation in the clock generation block of FIG. 10.

FIG. 10 shows details of the at-speed pulse generator 901 generating the pulses atspd_clk. By using the operational clock generated by the PLL 902 the at-speed pulse generator 901 can generate the scan test pulses atspd_clk with the operational frequency or at-speed. FIG. 11 shows a timing diagram of the different signals within the circuit of FIG. 10.

The pulse generation is started by the control signals scan_enable, scan_mode, and atspd_cyc_start, which are applied to a scan start cell 1001 performing an AND relation and an edge of the test clock TestClk. The output of the scan start cell 1001 is connected to the input of a D flip-flop whose clock input is triggered by the test clock TestClk and whose output signal Qs is inverted and fed back to an input of the scan start cell 1001. The signal Qs is input to the data input of the first D flip-flop Q0 of a chain of D flip-flops Q0 to Q4 whose clock inputs are all triggered by the operational clock PllClkOut in order to synchronize Qs to the operational clock PllClkOut.

Qs becomes 1 on the triggering edge (e.g. rising edge in this implementation) of TestClk if scan_mode=1, scan_enable=0 and atspd_cyc_start=1, and Qs will go back to 0 on the next cycle of TestClk, i.e. Qs is a square pulse with the width equal to one cycle of TestClk. Q0 and Q1 are synchronization stages between TestClk and PllClkOut. The signal cycle_en becomes 1 when both Q2 and Q4 are 1. The pulse width of cycle_en is equal to 2 cycles of PllClkOut. After the clock gating cell 1002 atspd_clk shows 2 pulses of PllClkOut, which can be used as at-speed launch and capture pulses.

Figure 12:
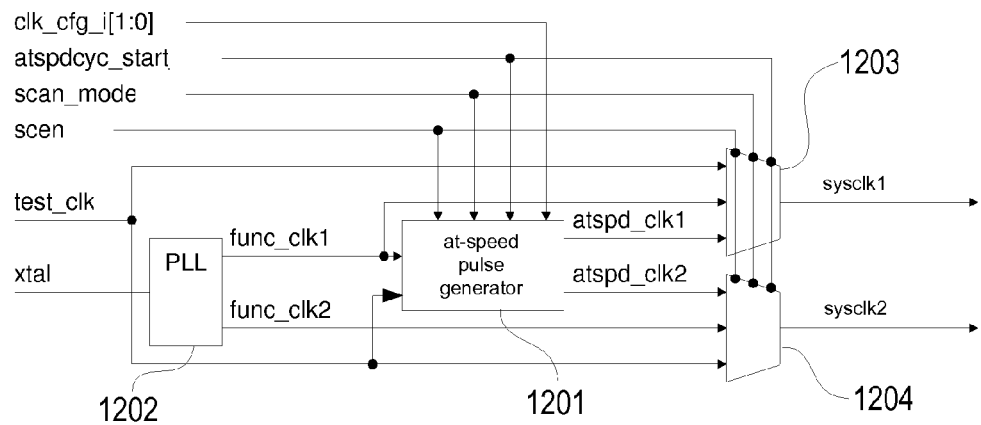
FIG. 12 shows a schematic block diagram of a circuit that generates and selects clocks for a scan test for two clock domains.

FIG. 12 shows a schematic block diagram of a circuit that generates two system clocks sysclk1 and sysclk2 for two systems forming two clock domains according to an embodiment of the present invention. The circuit comprises an at-speed pulse generator 1201, for the two systems two multiplexers 1203, 1204 and a PLL 1202. Like in the other embodiments each of the multiplexers 1203, 1204 provides a system clock sysclk1, sysclk2, respectively for clocking the memory cells in the corresponding system. For that purpose both multiplexers 1203, 1204 receive as input signals a test clock testclk, a corresponding operational clock func_clk1 and func_clk2, respectively, and a corresponding scan test clock atspd clk1 and atspd clk2, respectively, and select from these three input clocks one dependent on the three control signals atspdcyc_start, scan_mode and scen. Each of the multiplexers 1203, 1204 selects the output according to the following scheme: the corresponding operational clock func_clk1 or func_clk2 when scan_mode=0 independent of the status of the other signals, the test clock test_clk when scen=1 or when atspdcyc_start=0, and the corresponding at-speed test clock pulses atspd_clk1 or atspd_clk2 when scen=0 and atspdcyc_start=1.

The two operational clocks func_clk1 and func_clk2 are generated by the PLL 1202. One operational clock func_clk1 is provided to the at-speed pulse generator 1201 to enable it to generate the pulses or clocks atspd_clk1 and atspd_clk2 used for the scan test at an operational clock frequency or in other words at-speed.

Figure 13:
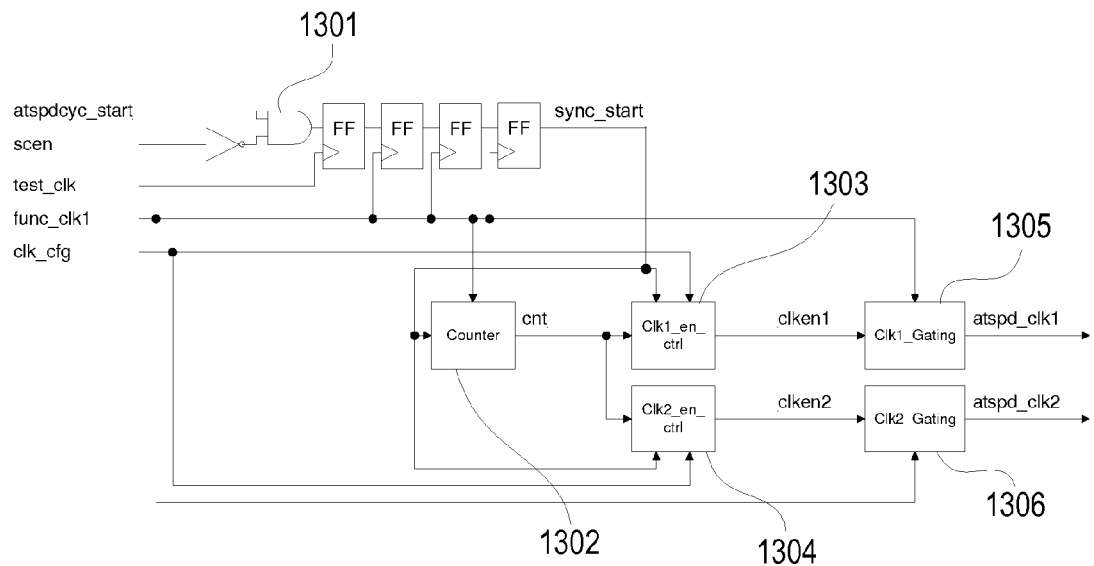
FIG. 13 shows details of the clock generation block of FIG. 12.

FIG. 13 shows a detailed block diagram for the at-speed pulse generator 1201 from FIG. 12. The circuit and the function of the pulse generator 1201 will be described in the following with reference to FIGS. 14 a) to d) showing timing diagrams of signals involved in the operation of the pulse generator 1201. The different diagrams a) to d) show diagrams for four different operational modes depending on the state of the configuration signal clk_cfg which can adopt four different states 0, 1, 2 or 3. The configuration signal clk_cfg may be like in the shown embodiment two digital lines with two states respectively which together can represent four different states. In every state one launch and one capture pulse is generated, i.e. two consecutive pulses. The configuration signal controls what clock domain gets the first and what clock domain gets the second pulse. To achieve this the at-speed pulse generator 1201 generates the right pulse pattern at its pulse outputs, so that when the multiplexers 1203, 1204 are all switched to the inputs connected to the pulse generator 1201 the right pulses are provided to the right system clock output sysclk1, sysclk2 and thereby to the right clock domain. The control inputs of both multiplexers 1203, 1204 are connected together so that they are controlled in the same manner.

The pulse generator 1201 comprises a chain of flip-flops FF. The flip-flops may be D flip-flops or can be of any other type of toggle flip-flops where a signal state at an input of the flip-flop upon a trigger impulse like an rising or falling edge at an clock input of the flip-flop is transferred to an output of the flip-flop. The output of each flip-flop is connected to the input of the subsequent flip-flop. The input of the first flip-flop is connected to the output of an AND-gate 1301 with two inputs receiving at the first input atspdcyc_start and at the second input the negated scen signal. The clock input of the first flip-flop is connected to test_clk so that the output of the first flip-flop gets 1 or logical high upon a trigger impulse of test_clk if atspdcyc_start=1 and scen=0. The subsequent flip-flops are all triggered at their clock inputs by the signal func_clk1 in order to synchronize the output of the first flip-flop to the operational clock func_clk1. The output sync_start of the last flip-flop starts a counter 1302 which starts at 2 and with each clock cycle of func_clk1 decreases by 1 down to 0 and remains at 0 until the end of the launch/capture phase or until a reset.

The state of the counter 1302 is provided to a first clock enable controller 1303 generating a first clock enable signal clken1 and to a second clock enable controller 1304 generating a second clock enable signal clken2. Both clock enable controllers 1303, 1304 get the clock configuration signal clk_cfg and the same clock input as the counter 1302. The clock enable signals clken1, clken2 control the gating of pulses of the operational clock func_clk1 within two clock gates 1305, 1306 receiving both the operational clock func_clk1. The first clock gate 1305 receives the first clock enable signal clken1 and generates the pulses atspd_clk1 for the first clock domain and the second clock gate 1304 receives the second clock enable signal clken2 and generates the pulses atspd_clk2 for the second clock domain.

Both clock gates 1305, 1306 deliver at their output pulses of the operational clock func_clk1 as long as the corresponding input signal clken1 or clken2 is active or 1. This can be achieved by an AND relation between func_clk1 and clken1 or clken2 respectively.

In embodiments herein described the systems or the circuitry in the clock domains can comprise any kind of circuit elements necessary for operating the circuit according to the purpose of the circuit. The circuit elements preferably comprise memory cells that can be operated as scan test memory cells. Preferably but not necessarily these memory cells can be used also outside of the test mode as circuit elements.

The present invention provides a system which enables delay testing within clock domains and with crossing clock domains in an integrated circuit (IC) with multiple system clocks. Shifting cycles can be pulsed for all clock domains at a common low frequency which can be within the range of the ATE. This approach does not complicate the clock tree synthesis (CTS).

The integrated circuit having a limited number of logic circuit elements such as transistors can provide the delay fault testing. This reduces the cost of the integrated circuit and the complexity of the design. It further reduces the complexity of the test programming because only one frequency for the launch and the capture pulses has to be programmed. If the clock pulses at the two outputs of the at-speed-clock generator are driven in subsequent clock cycles, the first output can be used to drive a launch test cycle and the second output can be used to drive a capture test cycle.

If a signal indicates that the integrated circuit is in a scan test mode, this signal can be used to let the clock multiplexers select the shift clocks and the memory cells to be connected as shift registers. This has the advantage that the memory cells can be programmed by the shift registers to a specific state in which this integrated circuit has to be tested.

REFERENCE NUMBERS

201 At-speed clock generator
2020 PLL
2021-202N PLL
2031-203N Clock multiplexer
2041-204N Clock domain
301 Decision entity
302 Decision entity
303 Clock multiplexer
310 AND gate
311 Inverter
313 Flip-flop row
3141-314k Flip-flop
315 Flip-flop
316 XOR gate
320 AND gate
321 Inverter
320 AND gate
321 Inverter
323 Flip-flop row
3241-324k+1 Flip-flop
325 Flip-flop
326 XOR gate
330 OR gate
331 AND gate
332 Inverter
333 Flip-flop
334 AND gate
41 Multiplexer
42 Multiplexer
43 Multiplexer
51 Flip-flop
52 Flip-flop
53 logic gates
901 At-speed pulse generator
902 PLL
903 Multiplexer
904 System/clock domain
1001 Scan start cell
1002 Clock gating cell
1201 At-speed pulse generator
1202 PLL
1203 First multiplexer
1204 Second multiplexer
1301 AND gate
1302 Counter
1303 First clock enable controller
1304 Second clock enable controller
1305 First clock gate
1306 Second clock gate

The invention claimed is:

1. An integrated circuit comprising:
a plurality of memory cells being configurable as operational memory cells or as scan test memory cells;
a pulse generator configured to generate pulses for triggering the memory cells when the memory cells are configured as scan test memory cells; and
a multiplexer circuit in communication with the memory cells and configured to select one of the pulses of the pulse generator, an operational clock and a test shift clock according to an operational mode,
the pulse generator comprising an input receiving the operational clock and an input receiving the test shift clock.

2. The integrated circuit of claim 1,
wherein the integrated circuit comprises a phase-locked loop configured to generate the operational clock from a reference clock and a phase-locked loop configured to generate a test clock from the reference clock, the pulse generator being configured to generate the pulses from the test clock.

3. The integrated circuit of claim 1,
wherein the integrated circuit comprises a test shift clock input in communication with the multiplexer circuit.

4. The integrated circuit of claim 1,
wherein the integrated circuit comprises a plurality of clock domains, each clock domain coupled to a multiplexer circuit.

5. An integrated circuit comprising:
a plurality of memory cells being configurable as operational memory cells or as scan test memory cells;
a plurality of clock domains each comprising a subset of the plurality of memory cells;
a pulse generator configured to generate pulses to trigger the memory cells when the memory cells are configured as scan test memory cells, the pulse generator comprising a plurality of pulse outputs; and
a plurality of multiplexer circuits each in communication with the memory cells of one clock domain and configured to select one of the pulses of the pulse generator and an operational clock according to an operational mode;
wherein each of the plurality of pulse outputs of the pulse generator is coupled to an input of a different multiplexer.

6. The integrated circuit of claim 5,
wherein the pulse generator comprises a synchronizing circuit configured to synchronize a test enable signal to the operational clock.

7. The integrated circuit of claim 5,
wherein the pulse generator is configured to generate the pulses by gating the operational clock with enable signals.

8. The integrated circuit of claim 5,
wherein the pulse generator is configured to generate the pulses by gating a test shift clock with enable signals.

9. The integrated circuit of claim 8,
wherein the integrated circuit comprises an on-chip phase-locked loop configured to generate the test shift clock.

10. The integrated circuit of claim 5,
wherein the pulse generator is configured to select the pulse outputs for delivering the pulses based on a scan test configuration.

11. The integrated circuit of claim 10,
wherein the scan test configuration comprises a launch information and a capture information, and the pulse generator is configured to generate two pulses and is configured to output the first pulse at a pulse output indicated by the launch information and the second pulse at a pulse output indicated by the capture information.

12. The integrated circuit of claim 5,
wherein the integrated circuit comprises a plurality of on-chip phase-locked loops configured to generate operational clocks.

13. An integrated circuit comprising:
a plurality of memory cells being configurable in an operational mode or in a scan test mode;
a plurality of clock domains; and
pulse configuration circuitry configured to receive a scan test mode indicator and configured to generate scan test control signals controlling an application of scan test pulses within the plurality of clock domains to trigger the memory cells when configured in a scan test mode; and
wherein the pulse configuration circuitry is configured to generate a launch scan test control signal for one of the plurality of clock domains to indicate whether the memory cells in said clock domain are triggered by a launch scan test pulse, and a capture scan test control signal to indicate whether the memory cells in said clock domain are triggered by a capture scan test pulse.

* * * * *